(12) United States Patent
Ji

(10) Patent No.: US 12,356,727 B2
(45) Date of Patent: Jul. 8, 2025

(54) HIGH VOLTAGE SEMICONDUCTOR DEVICE WITH ESD SELF-PROTECTION CAPABILITY AND MANUFACTURING METHOD THEREOF

(71) Applicant: SK keyfoundry Inc., Cheongju-si (KR)

(72) Inventor: Hee Hwan Ji, Daejeon (KR)

(73) Assignee: SK keyfoundry Inc., Cheongju-si (KR)

( * ) Notice: Subject to any disclaimer, the term of this patent is extended or adjusted under 35 U.S.C. 154(b) by 472 days.

(21) Appl. No.: 17/563,444

(22) Filed: Dec. 28, 2021

(65) Prior Publication Data

US 2023/0023179 A1     Jan. 26, 2023

(30) Foreign Application Priority Data

Jul. 23, 2021    (KR) .................. 10-2021-0097258

(51) Int. Cl.
*H10D 30/60*       (2025.01)
*H10D 30/65*       (2025.01)
*H10D 89/60*       (2025.01)

(52) U.S. Cl.
CPC ......... *H10D 89/811* (2025.01); *H10D 30/603* (2025.01); *H10D 30/65* (2025.01)

(58) Field of Classification Search
CPC ........... H01L 29/66659; H01L 29/7816; H01L 29/665; H01L 29/7835; H01L 29/66681; H01L 29/0878; H10D 89/811; H10D 30/65; H10D 30/603
USPC ................. 257/327, 339, 388, 412, E21.409, 257/E21.417, E21.438, E29.256, E29.268; 438/197, 283, 286
See application file for complete search history.

(56) References Cited

U.S. PATENT DOCUMENTS

| | | | |
|---|---|---|---|
| 5,844,272 A | 12/1998 | Soderbarg et al. | |
| 6,257,274 B1 | 7/2001 | Maehara | |
| 2006/0001050 A1* | 1/2006 | Wang | H01L 29/7836 |
| | | | 257/E29.268 |

(Continued)

FOREIGN PATENT DOCUMENTS

| | | |
|---|---|---|
| JP | 2018-129327 A | 8/2018 |
| JP | 2020-205308 A | 12/2020 |

(Continued)

OTHER PUBLICATIONS

Korean Office Action issued on Oct. 17, 2022, in counterpart Korean Patent Application No. 10-2021-0097258 (9 pages in Korean).

(Continued)

*Primary Examiner* — David Chen
(74) *Attorney, Agent, or Firm* — NSIP Law

(57) ABSTRACT

A semiconductor device includes a P-type body region and an N-type drift region disposed in a substrate; a gate electrode, disposed on the P-type body region and the N-type drift region, including a high concentration doping region and a high resistance region, wherein a dopant concentration of the high concentration doping region is higher than a dopant concentration of the high resistance region; a spacer disposed on a side of the gate electrode; a highly doped source region disposed in the P-type body region; and a highly doped drain region disposed in the N-type body region. The high concentration doping region overlaps the P-type body region, and the high resistance region overlaps the N-type drift region.

16 Claims, 16 Drawing Sheets

(56) References Cited

U.S. PATENT DOCUMENTS

| | | | | |
|---|---|---|---|---|
| 2009/0283825 A1* | 11/2009 | Wang | ................ | H01L 29/66621 |
| | | | | 257/E29.256 |
| 2010/0237439 A1* | 9/2010 | Lee | ................ | H01L 29/4983 |
| | | | | 257/408 |
| 2010/0244965 A1* | 9/2010 | Shima | ................ | H01L 29/7835 |
| | | | | 257/E29.256 |
| 2011/0266614 A1* | 11/2011 | Khan | ................ | H01L 29/7835 |
| | | | | 257/E29.261 |
| 2013/0181286 A1* | 7/2013 | Zhang | ................ | H01L 29/665 |
| | | | | 257/E29.256 |
| 2013/0277741 A1 | 10/2013 | Guowei et al. | | |
| 2015/0187938 A1* | 7/2015 | Tang | ................ | H01L 21/823892 |
| | | | | 257/408 |
| 2018/0130903 A1* | 5/2018 | Lin | ................ | H01L 21/761 |
| 2019/0058039 A1* | 2/2019 | Cai | ................ | H01L 29/0634 |
| 2021/0083109 A1* | 3/2021 | Hsu | ................ | H01L 29/665 |
| 2021/0359130 A1* | 11/2021 | Jain | ................ | H10D 64/685 |
| 2022/0093751 A1* | 3/2022 | Tailor | ................ | H10D 64/111 |

FOREIGN PATENT DOCUMENTS

| | | |
|---|---|---|
| KR | 10-2000-0029578 A | 5/2000 |
| KR | 10-2000-0039155 A | 7/2000 |
| KR | 10-2019-0109685 A | 9/2019 |
| WO | WO 98/05076 A2 | 2/1998 |

OTHER PUBLICATIONS

Korean Office Action issued on Apr. 11, 2023, in counterpart Korean Patent Application No. 10-2021-0097258 (5 pages in Korean).

* cited by examiner

HIGH VOLTAGE SEMICONDUCTOR DEVICE WITH ESD SELF-PROTECTION CAPABILITY AND MANUFACTURING METHOD THEREOF

CROSS-REFERENCE TO RELATED APPLICATION

This application claims the benefit under 35 U.S.C. § 119 of Korean Patent Application No. 10-2021-0097258 filed on Jul. 23, 2021, in the Korean Intellectual Property Office, the entire disclosure of which is incorporated herein by reference for all purposes.

BACKGROUND

1. Field

The following disclosure relates to a high voltage semiconductor device with ESD self-protection capability and manufacturing method thereof.

2. Description of Related Art

A high voltage semiconductor device such as a Lateral Double-diffused MOSFET (LDMOS) or an Extended Drain MOSFET (EDMOS) etc. may be used for Power Management Integrated Circuits (PMIC) and LED/LD driver products.

The high voltage semiconductor device may not use a separate ESD device and composes a Power-Array (PA) with an LDMOS or an EDMOS having a wide width (total width of transistor ≥5 mm).

Thus, when an ESD surge event occurs, a self-protection capability (SPC) may be used to respond to it. When a self-protection capability (SPC) is insufficient, the PA area may be enlarged; therefore, an SPC may be a desirable factor for competitively reducing a chip size.

A breakdown voltage in a high voltage device may be improved using a Reduced Surface Electric Field (RESURF) structure; however, the self-protection capability (SPC) may decrease while improving the breakdown voltage.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, a semiconductor device includes a P-type body region and an N-type drift region disposed in a substrate; a gate electrode, disposed on the P-type body region and the N-type drift region, including a high concentration doping region and a high resistance region, wherein a dopant concentration of the high concentration doping region is higher than a dopant concentration of the high resistance region; a spacer disposed on a side of the gate electrode; a highly doped source region disposed in the P-type body region; and a highly doped drain region disposed in the N-type body region. The high concentration doping region overlaps the P-type body region, and the high resistance region overlaps the N-type drift region.

The semiconductor device may further include a gate silicide film disposed on the gate electrode. The gate silicide film may overlap the high concentration doping region and the high resistance region.

The semiconductor device may further include a P-type buried layer disposed under the N-type drift region, an N-type buried layer disposed under the P-type buried layer, and a deep trench structure disposed on each opposite side of the N-type buried layer.

The high resistance region may be a low concentration doping region or an undoped region.

The high concentration doping region may be nearer to the highly doped source region than the highly doped drain region. The high resistance region may be nearer to the highly doped drain region than the highly doped source region. A concentration of the high concentration doping region may be similar to a concentration of either the highly doped source region or the highly doped drain region.

The semiconductor device may further include a gate insulating film disposed on the substrate, and a silicide blocking insulating film disposed to extend from a top surface of the gate electrode to partially overlap the highly doped drain region. The silicide blocking insulating film may contact the high resistance region, and the high resistance region may contact the gate silicide film, the gate insulating film, and the silicide blocking insulating film.

In another general aspect, a manufacturing method of a semiconductor device, includes forming a P-type body region and an N-type drift region in a substrate; forming a gate electrode, comprising a high concentration doping region and a high resistance region, on the P-type body region and the N-type drift region, wherein a dopant concentration of the high concentration doping region is higher than a dopant concentration of the high resistance region; forming a spacer on a side of the gate electrode; forming a highly doped source region and a highly doped drain region in the P-type body region and the N-type drift region, respectively; forming a silicide blocking insulating film extending from a top surface of the gate electrode to partially overlap the highly doped drain region; and forming a gate silicide film on a surface of the gate electrode. The high concentration doping region overlaps the P-type body region, and the high resistance region overlaps the N-type drift region.

The forming of the gate electrode may include forming a first mask pattern on a first region where the high concentration doping region is formed, performing, using the first mask pattern, a low concentration ion implantation in a second region where the high resistance region is formed, and removing the first mask pattern.

The forming of the highly doped source region and highly doped drain region may include forming a second mask pattern on the second region where the high resistance region is formed, performing, using the second mask pattern, a high concentration ion implantation in the first region where the high concentration doping region is formed, and removing the second mask pattern. The high concentration doping region, the highly doped source region and the highly doped drain region may be simultaneously formed by performing the high concentration ion implantation.

The manufacturing method may further include forming an N-type buried layer in the substrate, and forming a P-type buried layer on the N-type buried layer.

The manufacturing method may further include forming a deep trench structure on opposite sides of the N-type buried layer.

The high resistance region may be a low concentration doping blocking region or an undoped region.

The high concentration doping region may be formed adjacent to the highly doped source region. The high resistance region may be formed adjacent to the highly doped drain region. A concentration of the high concentration doping region may be similar to a concentration of either the highly doped source region or the highly doped drain region.

The manufacturing method may further include forming a gate insulating film on the substrate. The silicide blocking insulating film may contact the high resistance region, and the high resistance region may contact the gate silicide film, the gate insulating film, and the silicide blocking insulating film.

In another general aspect, a semiconductor device includes a gate electrode, disposed on a P-type body region and a N-type drift region, comprising a high concentration doping region and a high resistance region, wherein a dopant concentration of the high concentration doping region and a dopant concentration of the high resistance region are different; a spacer disposed on a side of the gate electrode; a highly doped source region disposed in the P-type body region; and a highly doped drain region disposed in the N-type body region. The high concentration doping region overlaps the P-type body region and the N-type drift region.

The high resistance region may overlap the highly doped drain region.

The high resistance region may be spaced apart from the highly doped drain region.

The semiconductor device may further include a P-type buried layer disposed under the N-type drift region; and an N-type buried layer disposed under the P-type buried layer and the P-type body region.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
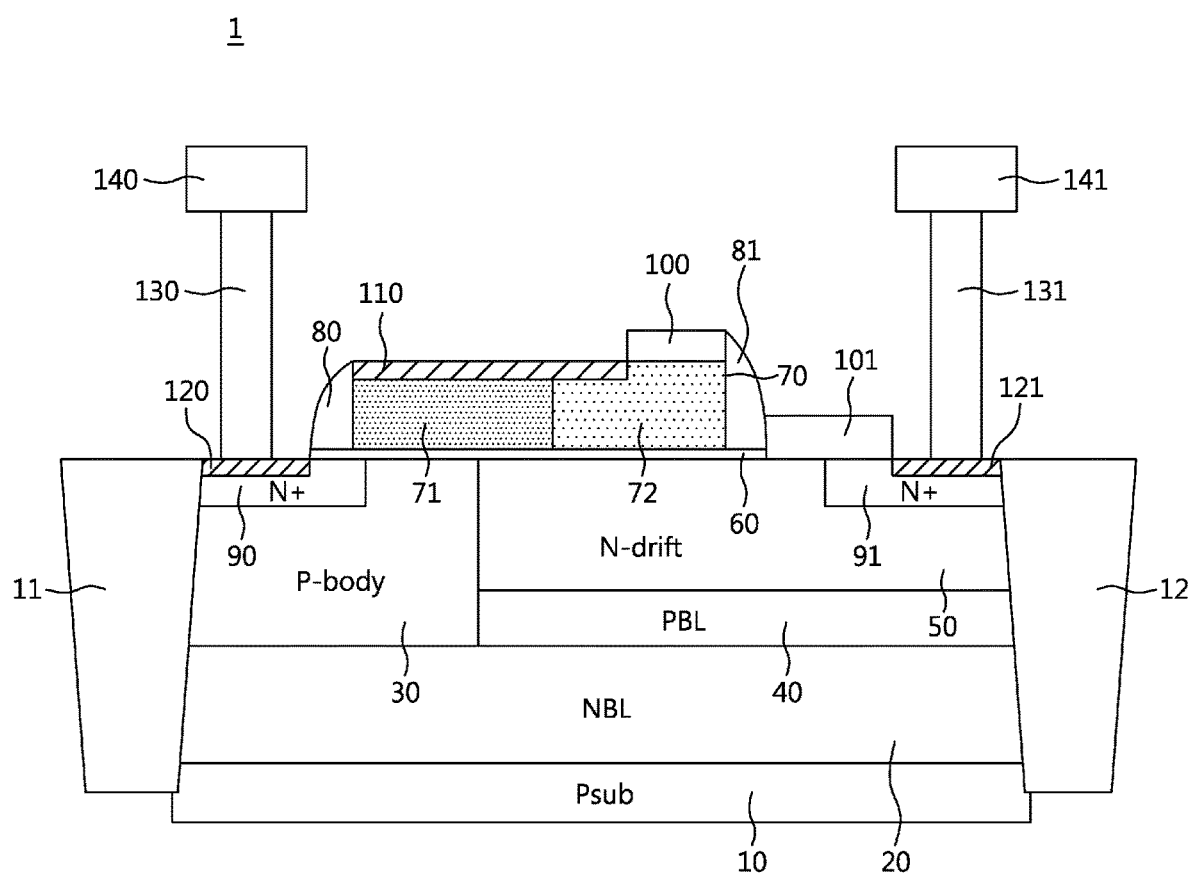
FIG. 1 is a cross-sectional view of a semiconductor device according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The disclosure solves the above-identified issue and provides a high voltage semiconductor device that maintains a RESURF feature and increases a self-protection capability (SPC) by applying a gate poly RESURF method and a manufacturing method thereof.

As an example of the disclosure, an LDMOS (Lateral Double diffused Metal Oxide Semiconductor) and an EDMOS (Extended Drain Metal Oxide Semiconductor), used as a high voltage semiconductor device, are typical lateral power devices having a rapid switching response and a high input impedance as a majority carrier device. An LDMOS or EDMOS device is a MOS device designed to be suitable for a portion where a high voltage is applied, such as an apparatus for a portable power management or a PC peripheral, etc. LDMOS or EDMOS devices may be formed on one chip with a CMOS (Complementary MOS) device. Moreover, an LDMOS or an EDMOS device may be fabricated in the form of a PIC (Power Integrated Circuit) that integrates a power device and a logic device in one chip.

Disclosed herein is a semiconductor device including a P-type body region 30 and an N-type drift region 50 formed in a substrate 10; a gate electrode 70 formed on the P-type body region 30 and the N-type drift region 50; a spacer 80 formed on a side of the gate electrode 70; a highly doped source region 90 formed in the P-type body region 30; and a highly doped drain region 91 formed in the N-type drift region 50. The gate electrode 70 may include a high concentration doping region 71 and a high resistance region 72. A dopant concentration of the high concentration doping region 71 may be higher than that of the high resistance region 72. The high concentration doping region 71 may be overlapped with the P-type body region 30, and the high resistance region 72 may be overlapped with the N-type drift region 50.

Hereinafter, a detailed description is given for the disclosure, according to the drawings.

FIG. 1 is a cross-sectional view of a semiconductor device according to one or more embodiments. More specifically, FIG. 1 shows a cross-sectional view of ED-type (Extended Drain-type) LDMOS (Lateral Double diffused MOS) with applying a gate poly RESURF method of the disclosure.

With reference to FIG. 1, a semiconductor device 1 according to one or more embodiments may include an N-type buried layer 20 formed in a substrate 10; a P-type body region 30 and an N-type drift region 50 formed on the N-type buried layer 20; a P-type buried layer 40 formed between the N-type buried layer 20 and the N-type drift region 50; a gate insulating film 60 formed on the P-type body region 30 and the N-type drift region 50; a gate electrode 70, formed on the gate insulating film 60, including a high concentration doping region 71 and a high resistance region 72; a spacer 80 formed on a side of the gate electrode 70; a highly doped source region 90 formed in the P-type body region 30; and a highly doped drain region 91 formed in the N-type drift region 50. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The gate electrode 70 may include the high concentration doping region 71 and the high resistance region 72. The high concentration doping region 71 may be formed adjacent and offset to a highly doped source region 90. The high resistance region 72 may be formed adjacent and offset to the highly doped drain region 91. Also, the high concentration doping region 71 may be overlapped with the P-type body region 30, and the high resistance region 72 may be disposed on the N-type drift region 50.

It may be desirable that the high concentration doping region 71 have a higher doping concentration than the high resistance region 72. The high concentration doping region 71 in the gate electrode 70 may reduce resistance of a current path.

In an example, the high resistance region 72 may be formed to have a lower concentration doping region. In the example, the high resistance region 72 may have a lower doping concentration than the high concentration doping region 71. Therefore, the high resistance region 72 may have a higher resistance than the high concentration doping region 71. Since the high concentration doping is blocked, the high resistance region 72 may have a lower doping concentration, and the doping efficiency may be reduced as much as it is blocked. The doping efficiency may refer to a value measured after an ion-implanted dopant is activated by a high temperature annealing or a rapid heat treatment, after forming a source/drain region. Therefore, a poly depletion may occur in the high resistance region 72. Poly depletion is a phenomenon that occurs because of insufficient doping inside a poly-silicon film. When a poly depletion occurs, it may imply that a relatively high resistance exists. Thus, although the high resistance region 72 is a gate electrode 70, it may be considered a field oxide layer or an insulating film with almost no carrier. It may be shown that a field oxide layer, like a LOCOS, may exist between a drain region 91 and a gate electrode 70; thus, may be helpful for a reduced surface electric field effect.

Generally, a high electric field occurring due to a highly doped drain region 91 may extend directly under the gate electrode 70. When an ESD event occurs in a state where a high electric field exists on a substrate surface under a gate electrode 70, a gate insulating film 60 directly under a gate electrode 70 may be destroyed, and the high voltage device 1 may not function normally. Therefore, there may be a desire to reduce the high electric field on a surface. A high resistance region 72 may be a thick insulating film, and it may play a role in reducing a surface electric field. The high resistance region 72 and a reduced surface electric field effect (RESURF) may improve a self-protection capability (SPC) against an ESD event. This is a gate poly RESURF effect.

A separate field plate (not shown) may be formed between a highly doped drain region 91 and a gate electrode 70 for a reduced surface electric field (RESURF). A separate field plate may reduce a surface electric field, but an ESD discharge path may be formed when a separate field plate is electrically connected with a source contact plug. In this case, a sufficient holding voltage (Vh) for an ESD discharge may not be attained, and a snapback characteristic, which is one of ESD characteristics, may be worsened.

Thus, a field plate may be formed using a gate electrode 70 itself and not formed as a separate field plate in the present disclosure. That is, a high resistance region 72 having a relatively high resistance, which was mentioned earlier, may be formed in a gate electrode itself. Therefore, a high resistance region 72 may play a role of a field plate, reducing a surface electric field.

Also, a high resistance region 72 may decrease a capacitance value (Cgd) between gate-drain because a thick insulating film may exist. And due to the decreased capacitance between gate-drain, it may help improve the switching speed.

Additionally, with reference to FIG. 1, a first spacer 80 made with an insulating film material may be formed on a side of a gate electrode 70 in an example of a semiconductor device of the disclosure.

Silicide blocking insulating films 81, 100 and 101 may be formed around a gate electrode. The silicide blocking insulating films 81, 100 and 101 may inhibit forming silicide films 110, 120 and 121.

First, the first silicide blocking insulating film 100 is formed on a partial surface of a gate electrode 70. The second silicide blocking insulating film 81 is formed on another side of the gate electrode 70. The third silicide blocking insulating film 101 is formed on an N-type drift region 50 and a highly doped drain region 91. The silicide film 121 is formed on an exposed highly doped drain region 91. The first silicide blocking insulating film 100, the second silicide blocking insulating film 81, and the third silicide blocking insulating film 101 may be simultaneously formed in the same step.

The second silicide blocking insulating film 81 may be an insulating film combining a spacer 80 and a silicide blocking insulating film because a spacer 80 is formed on opposite sides of a gate electrode 70, and a silicide blocking film is later formed. A second silicide blocking insulating film 81 may be similarly shaped as a spacer 80 but may be thicker.

The first silicide blocking insulating film 100 and the second silicide blocking insulating film 81 may be formed to contact a top and side surfaces of the high resistance region 72, respectively. It is because a high resistance region 72, a first silicide blocking insulating film 100, and a second silicide blocking insulating film 81 are all formed adjacent to a highly doped drain region 91.

The high resistance region 72 may directly contact a gate silicide film 110 and the gate insulating film 60 formed on a surface of the gate electrode 70. Thus, the high resistance region 72 may contact the gate silicide film 110, the gate insulating film 60, the first silicide blocking insulating film 100, and the second silicide blocking insulating film 81.

The gate silicide film 110 formed on a partial surface of the gate electrode 70 may be further included. Herein, the gate silicide film 110 is formed on a partial surface of the gate electrode 70, except for a section where the silicide blocking insulating film 100 is formed. The gate silicide film 110 may be overlapped with the high concentration doping region 71 and high resistance region 72.

In one or more embodiments, the semiconductor device of the present disclosure may also include first and second silicide films 120 and 121 formed in the highly doped source region 90 and the highly doped drain region 91, respectively. The first and second silicide films 120 and 121 may be used to lower resistance between contact plugs 130 and 131, and a substrate 10. In an example, the silicide film may be formed using TiSi2, NiSi, or CoSi2.

In one or more embodiments, the semiconductor device of the disclosure may further include a source contact plug 130 and a drain contact plug 131 formed on a highly doped source region 90 and a highly doped drain region 91, respectively; and metal wirings 140 and 141 formed on the source contact plug 130 and the drain contact plug 131, respectively. Ti/TiN/W material may be used for contact plugs 130 and 131. Al, AlCu, or Cu, etc. may be used for a material of the metal wirings 140 and 141.

In one or more embodiments, in the semiconductor device of the disclosure, it may be desirable that the substrate 10 is a P-type silicon substrate (Psub), and the N-type buried layer 20, which is a high concentration doping region in a substrate, may be formed. Herein, the N-type buried layer 20 may be needed for a fully isolated MOS device in a high voltage device. Being 'fully isolated' may be used for applying a bias that is different from a substrate to a P-type body region 30 or an N-type drift region 50. Also, an isolation that uses the N-type buried layer 20 may achieve a better noise reduction by switching a high voltage device. Accordingly, in one or more embodiments, an N-type buried layer 20 having a high concentration may be used to reduce leakage current by minimizing the gain in a parasitic PNP structure, which is made as a P-type body region 30/N-type buried layer 20/substrate 10. While numerous high voltage devices perform fast switching, traces of leakage current may be evident as more power consumption or heat. Therefore, there may be a case that requires a low gain below 0.1. Meanwhile, a P-type body region 30 may be needed to form a channel region in a semiconductor device of the disclosure.

In one or more embodiments of the semiconductor device of the disclosure, a deep trench structure (Deep Trench Isolation, DTI, 11, 12) formed on each of the opposite sides of the N-type buried layer 20 may be included. The DTI 11, 12 formed on each of the opposite sides of the N-type buried layer 20 may be a device isolation region to isolate an adjacent device. In an example, an STI (Shallow Trench Isolation), an MTI (Medium Trench Isolation), etc. may be used for the device isolation region, except DTI 11, 12. Further, a LOCOS may be used instead of the STI for the device isolation region. And a trench region may be formed by filing a material such as silicon silicide blocking insulating film (SiO2), a silicon nitride layer (SiN), a polysilicon (Poly-Si), etc., or a combination of the above materials.

Figure 2:
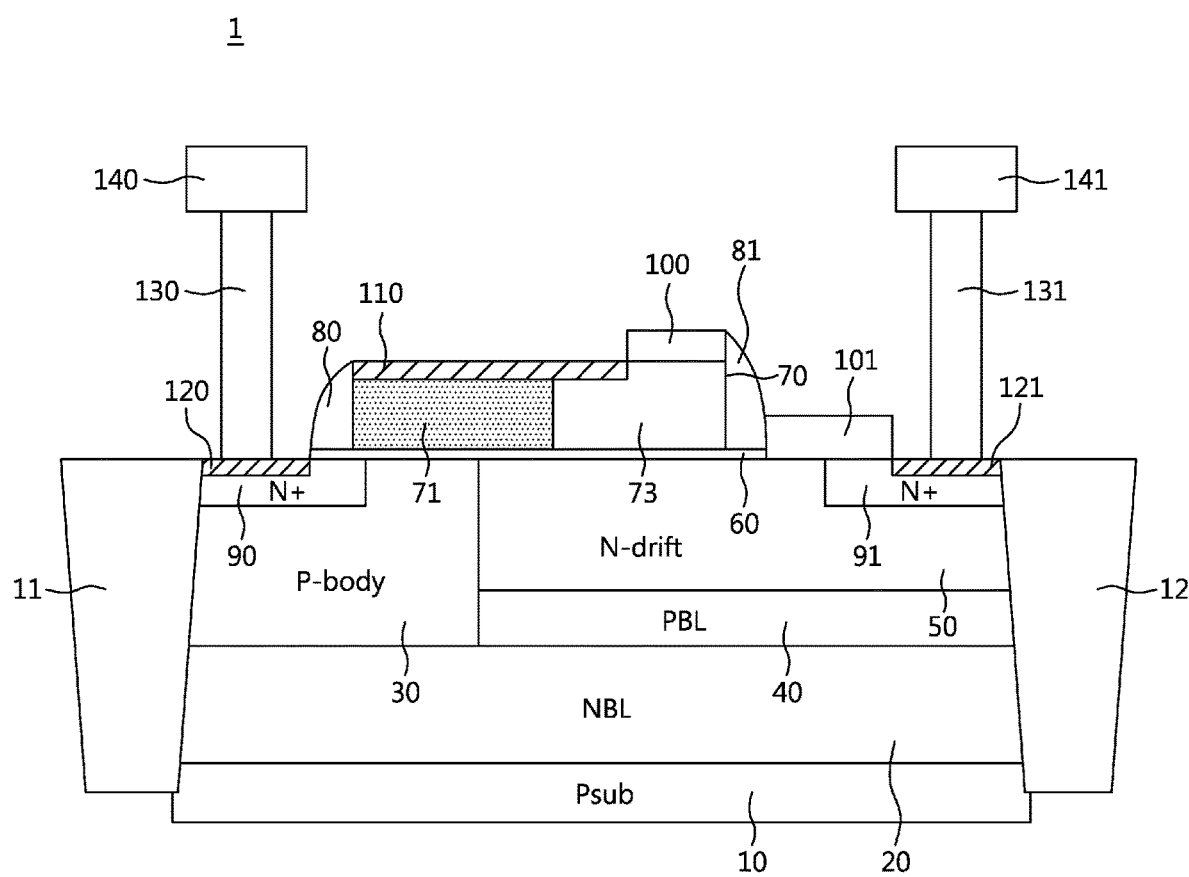
FIG. 2 is a cross-sectional view of a semiconductor device according to one or more embodiments.

FIG. 2 is a cross-sectional view of a semiconductor device according to one or more embodiments.

With reference to FIG. 2, except for a high resistance region 73, the rest structure is similar to FIG. 1. The high resistance region 73 may be formed as an undoped region without injecting a dopant. An undoped region may be formed using a mask pattern to prevent ion implantation. Thus, the high resistance region 73 may have a higher resistance than a high concentration doping region 71. The high resistance region 73 of FIG. 2 may have a higher resistance than the high resistance region 72 of FIG. 1 because it is an undoped region.

Therefore, compared with a structure of FIG. 1, the high resistance region 73 of FIG. 2 may have a bigger effect for a reduced surface electric field (RESURF) because of the higher resistance. Likewise, a self-protection capability (SPC) against an ESD event may be further improved.

Figure 3:
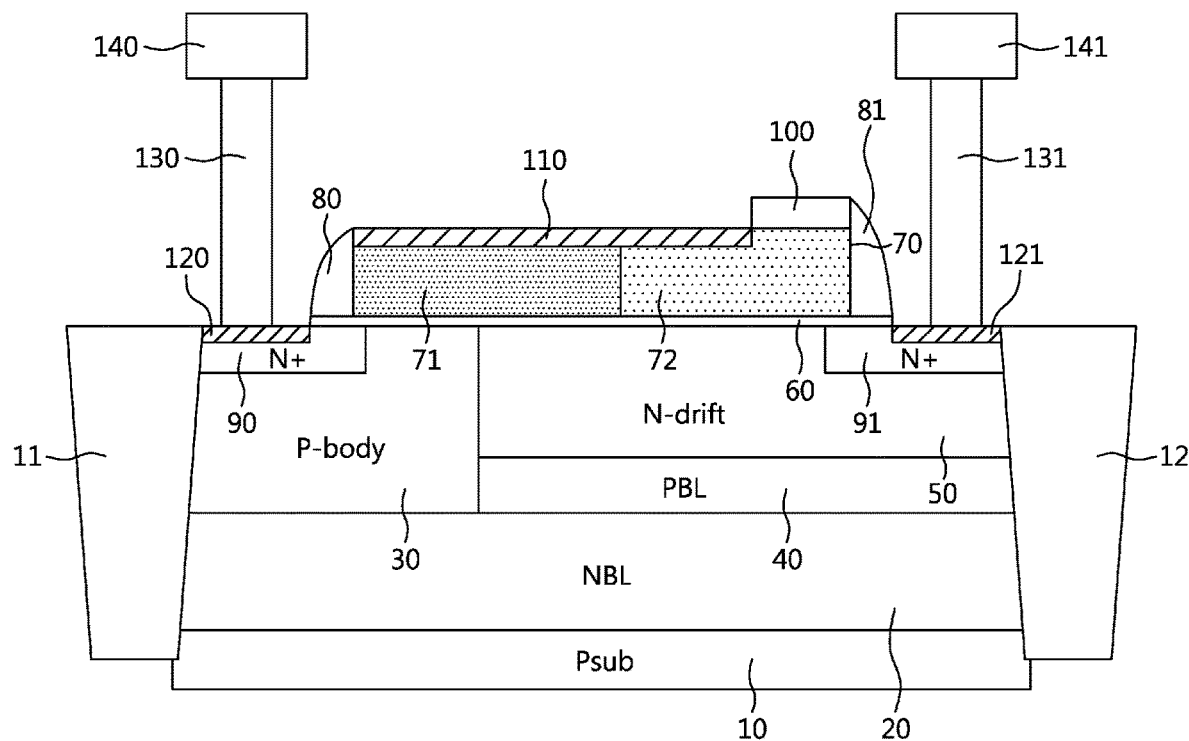
FIG. 3 is a cross-sectional view of a semiconductor device according to one or more embodiments.

FIG. 3 is a cross-sectional view of a semiconductor device according to one or more embodiments.

FIG. 3 depicts a cross-sectional view of DD-type (Double diffused-type) LDMOS (Lateral Double diffused MOS) with a gate poly RESURF. Except the LDMOS is a DD-type and has a similar structure with an ED-type LDMOS. The difference is that in FIG. 3, a portion of a gate electrode 70 overlaps a highly doped drain region 91. In FIGS. 1 and 2, the gate electrode 70 and the highly doped drain region 91 are formed spaced apart, which may increase the breakdown voltage. On the other hand, in FIG. 3, the breakdown voltage may decrease because a portion of a gate electrode 70 overlaps the highly doped drain region 91; however, the switching speed may be relatively faster than the structure shown in FIG. 1 and FIG. 2 due to the distance between the highly doped source region 90 and the highly doped drain region 91 being relatively smaller. In an example, the structure of FIG. 3 may have a similar effect of the high resistance region 72 in FIG. 1, so a detailed description is abridged.

Figure 4:
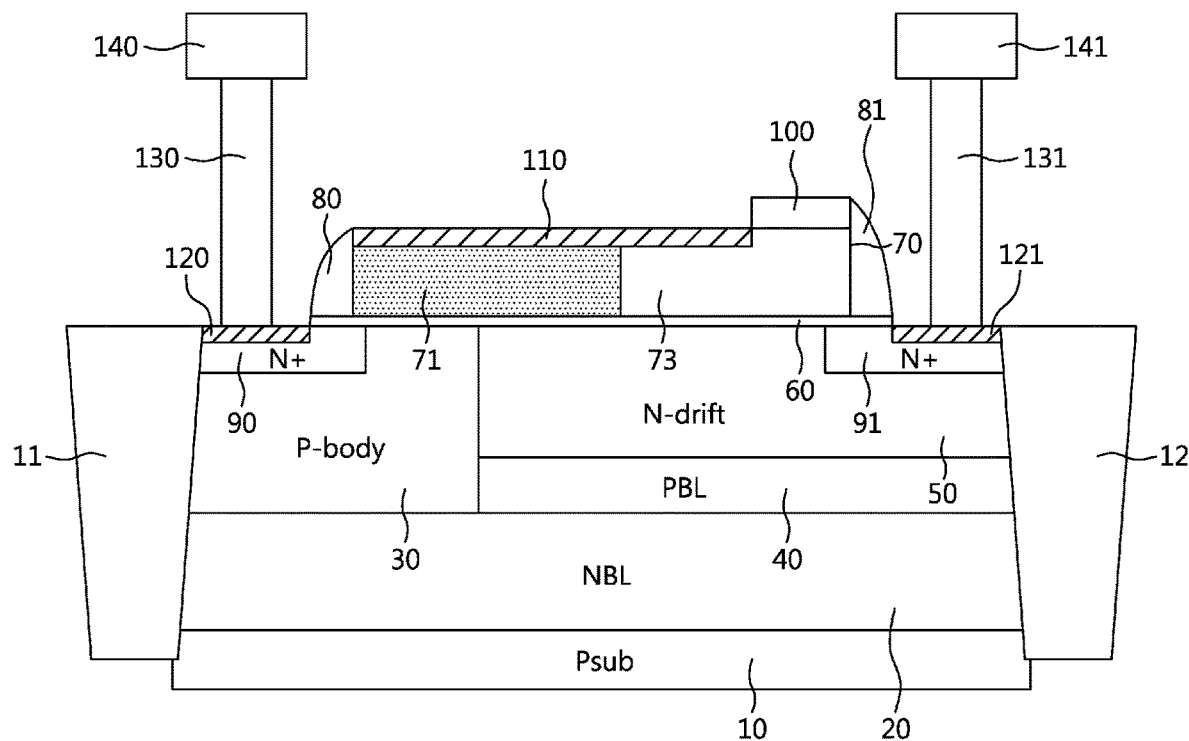
FIG. 4 is a cross-sectional view of a semiconductor device according to one or more embodiments.

FIG. 4 is a cross-sectional view of a semiconductor device according to one or more embodiments.

FIG. 4 is similar to FIG. 3, except the high resistance region 72 is changed to an undoped region 73. The structure of FIG. 4 may be similar to an effect of a high resistance region 72, 73 in FIG. 1 or FIG. 2, so detailed description is abridged.

Figure 5:
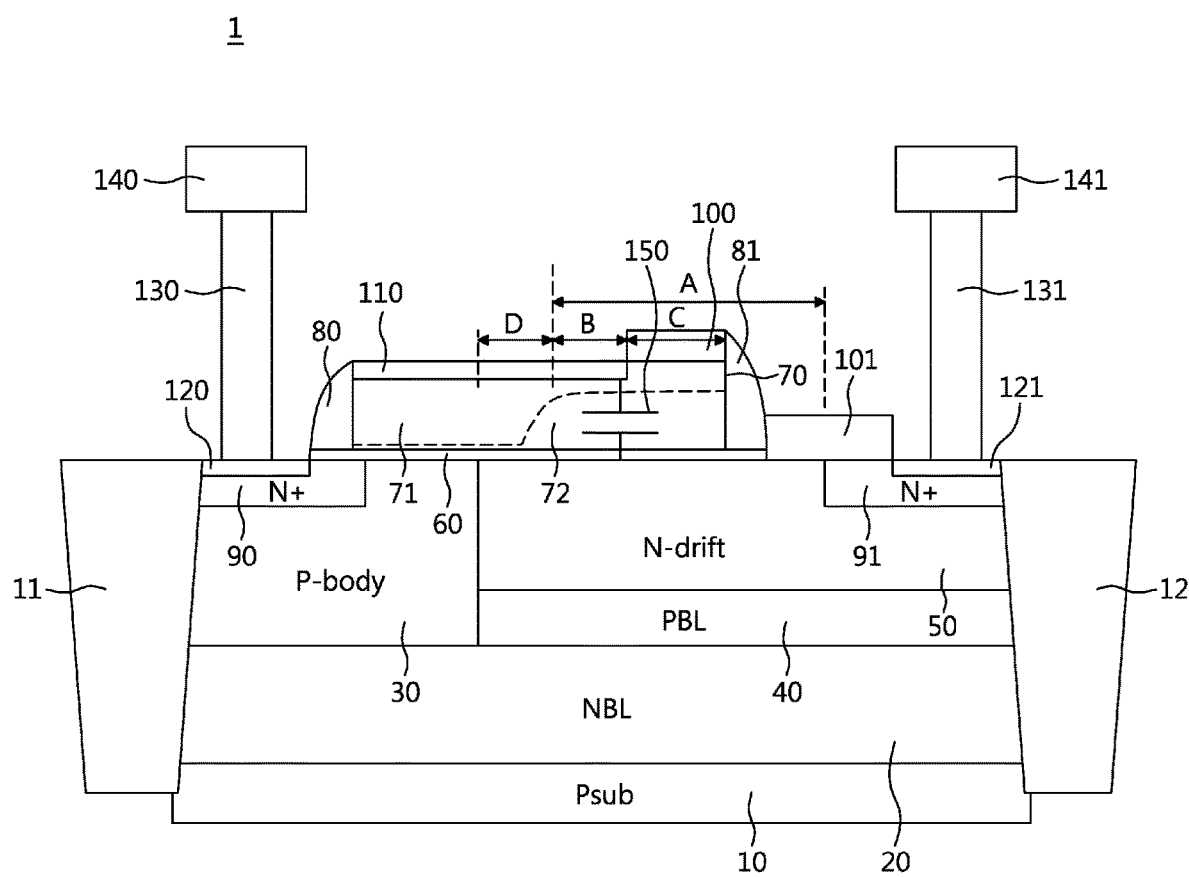
FIG. 5 is a cross-sectional view of a semiconductor device with a doping concentration according to one or more embodiments.

FIG. 5 is a cross-sectional view of a semiconductor device with a doping concentration according to one or more embodiments.

With reference to FIG. 5, in a semiconductor device of the disclosure, sections A, B, C, and D are shown about the center of a gate electrode 70. In FIG. 5, the dotted line depicts the doping degree or doping efficiency of the gate electrode 70. The doping efficiency may refer to a value measured after an ion-implanted dopant is activated by a high temperature annealing or a rapid heat treatment, after forming a source/drain region. A high doping efficiency may represent that an activated dopant is correspondingly high, and the resistance of a gate electrode is correspondingly low. In a high concentration doping region 71, a dotted line is drawn close to a gate insulating film 60, which may represent a very high doping concentration.

On the other hand, when the high concentration doping is blocked, the high resistance region 72 may have a low doping concentration, and the doping efficiency may correspondingly decrease. Thus, in a high resistance region 72, a dotted line is located relatively far from the gate insulating film 60. A poly depletion may occur in a high resistance region 72. A poly depletion is a phenomenon that occurs because of insufficient doping inside a poly-silicon film. When a poly depletion occurs, it may be considered that a considerably high resistance exists. Thus, a high resistance region 72 may be considered an insulating film with almost no carrier in a poly-silicon and may be used as a gate electrode.

Section A includes a high resistance region 72, a low concentration doping region, or an undoped region. Section A may refer to a distance from a starting point of the above-mentioned high resistance region 72 to a starting point of a highly doped drain region 91. The longer the length of section A is, the longer the length of the high resistance region 72, the low concentration doping region, or the undoped region becomes.

Section B is a Field Plate (FP) section and a gate silicide layer 110 is formed in section B; therefore, the length of a field plate may be adjusted. The longer the length of section B is, the longer the length of the field plate. The above-mentioned reduced surface electric field effect (RESURF) may increase in proportion to the length of section B.

Section C is a breakdown voltage section between the gate-drain (Gate to Drain BV). The longer the length of C is, the more a breakdown voltage between gate-drain (Gate to Drain BV) is improved. However, there is a drawback to increasing the length of a unit device. Therefore, it may be desirable to minimize the length of the unit device in a device of an array form.

Section D is an overlap cap (Cgd) section. Section D overlaps an N-type drift region 50. Thus, it is a distance starting from a left end of an N-type drift region to a starting point of a high resistance region 72 or a low concentration doping region 72. Since a drift region 50 may also be equivalent to a drain region, a MIS capacitor structure 150 that is composed of a gate electrode 70-a gate insulating film 60-a drift region 50 may be formed. Therefore, a gate-drain capacitance (Cgd) value may be increased because the longer a length of D is, the bigger a MIS capacitor 150 area is. Thus, a length may be adjusted suitably to reduce a Cgd value. When a gate-drain capacitance (Cgd) value is increased, a switching speed may be dropped.

In a semiconductor device of the disclosure, by adjusting a ratio of section A, B, C, and D, an SPC may be increased, and an Electro-Static Discharge (ESD) protection property may be improved. Furthermore, according to one or more embodiments, a semiconductor device may embody a gate poly RESURF method and improve an SPC by dividing a high concentration doping region 71 and a high resistance region 72, each of which may have different doping concentrations of a gate electrode 70.

Figure 6:
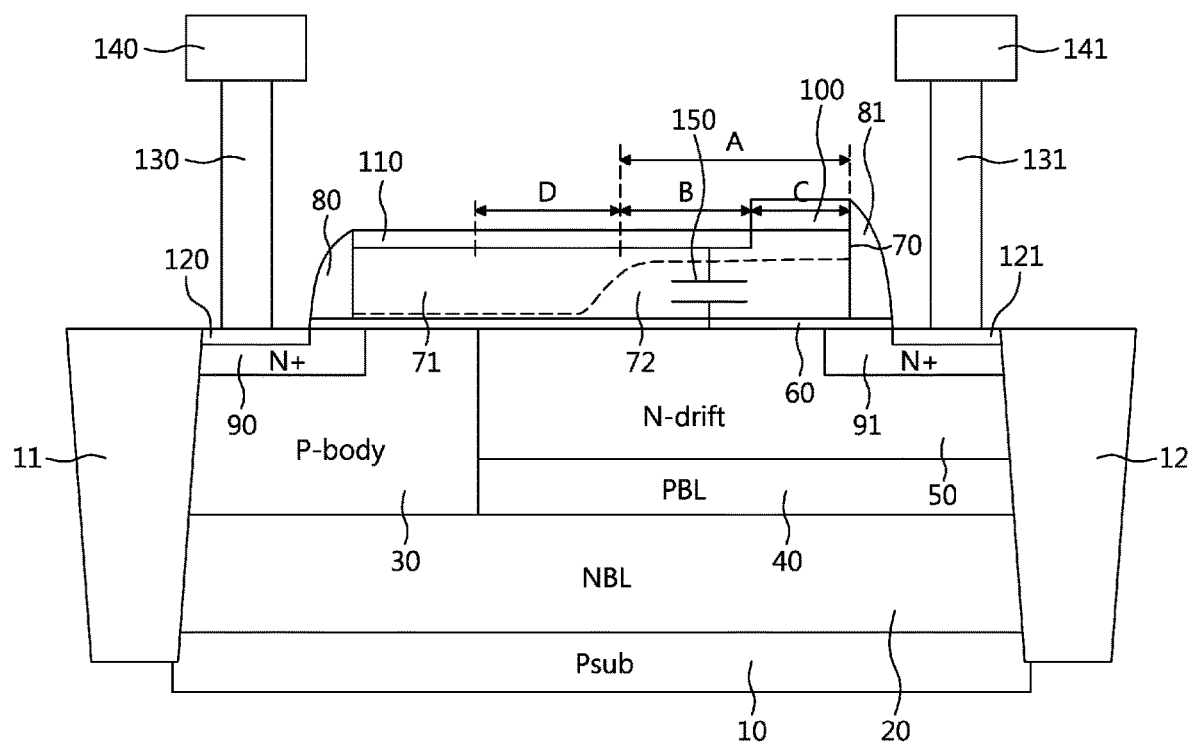
FIG. 6 is a cross-sectional view of an example of a DD-type (Double Diffused-type) LDMOS (Lateral Double-diffused MOS) applying a gate poly RESURF method of the disclosure.

FIG. 6 is a cross-sectional view of an example of a DD-type (Double Diffused-type) LDMOS (Lateral Double-diffused MOS) applied to a gate poly RESURF method of the disclosure.

FIG. 6 has a similar structure to FIG. 5 and similarly includes sections A, B, C, and D that are mostly similar, except a length of section A is shorter because a highly doped drain region 91 is overlapped with a gate electrode 70.

As described above, a semiconductor device of the disclosure relates to a high voltage semiconductor device using a gate poly RESURF method and may be applied to a high-frequency application. For example, it may be used for a gate drive IC used in a PMIC DC-DC converter for a mobile or a gate drive IC for a motor drive. Also, it may be used for an RF device or a switching power MOSFET device.

Additionally disclosed is a manufacturing method of a semiconductor device including forming a P-type body region 30 and an N-type drift region 50 in a substrate 10; forming a gate electrode 70 on the P-type body region 30 and the N-type drift region 50; forming a spacer 80 on a side of the gate electrode 70; respectively forming a highly doped source region 90 and a highly doped drain region 91 in the P-type body region 30 and the N-type drift region 50; forming silicide blocking insulating films 81, 100 and 101 Silicide blocking insulating films 81, 100 and 101 from a top of the gate electrode 70 to near the highly doped drain region 91; and forming a gate silicide film 110 on a surface of the gate electrode 70. The gate electrode 70 may include a high concentration doping region 71 and a high resistance region 72. A dopant concentration of the high concentration doping region 71 may be higher than that of the high resistance region 72. The high concentration doping region 71 may be overlapped with the P-type body region 30, and the high resistance region 72 may be overlapped with the N-type drift region 50.

FIG. 7 to FIG. 12 show stages of a manufacturing method of a semiconductor device according to one or more embodiments.

Figure 7:
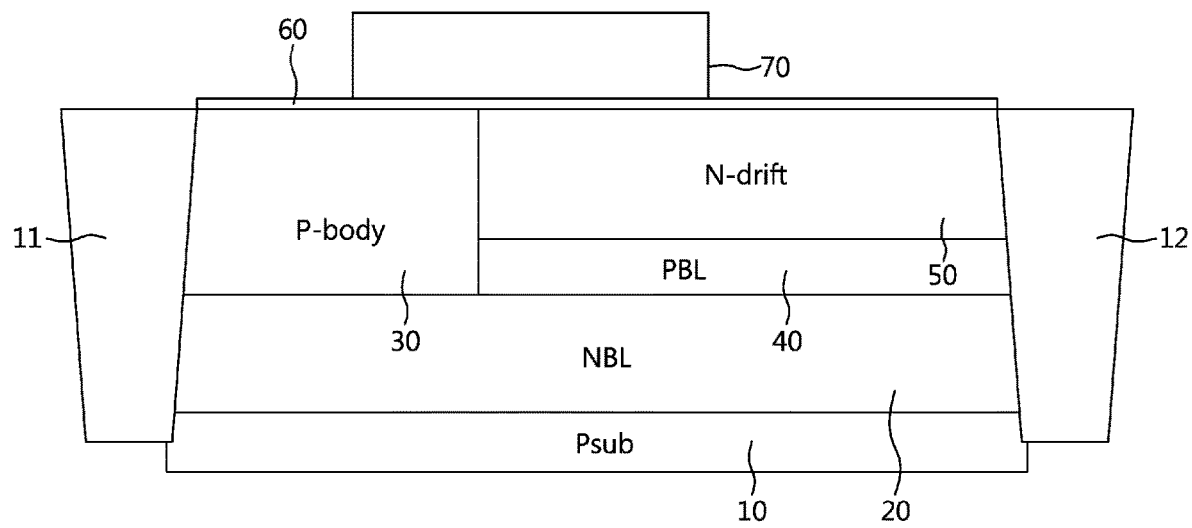
FIG. 7 to FIG. 12 show stages of a manufacturing method a semiconductor device according to one or more embodiments.

With reference to FIG. 7, a manufacturing method of a semiconductor device of the disclosure may include forming an N-type buried layer 20 in a substrate 10; forming a P-type body region 30, a P-type buried layer 40, and an N-type drift region 50 on the N-type buried layer 20; forming a gate insulating film 60 on the P-type body region 30 and the N-type drift region 50; and forming a gate electrode 70 on the gate insulating film 60. A gate electrode 70 may be formed through a patterning process and depositing a conductive layer with a poly-silicon material on a gate insulating film.

Also, a manufacturing method of a semiconductor device of the disclosure may further include forming a deep trench structure 11, 12 on opposite sides of an N-type buried layer 20, respectively. A DTI 11, 12 formed on each opposite side of the N-type buried layer 20 may be equivalent to a device isolation region to isolate an adjacent device. STI (Shallow Trench Isolation), MTI (Medium Trench Isolation), etc. may be used for the device isolation region, except DTI 11, 12. Further, a LOCOS may be used instead of the STI for the device isolation region. A trench region may be formed by filing a material such as a silicon silicide blocking insulating film (SiO2), a silicon nitride layer (SiN), a poly-silicon (Poly-Si), etc. or it may be formed by combining those materials.

Figure 8:
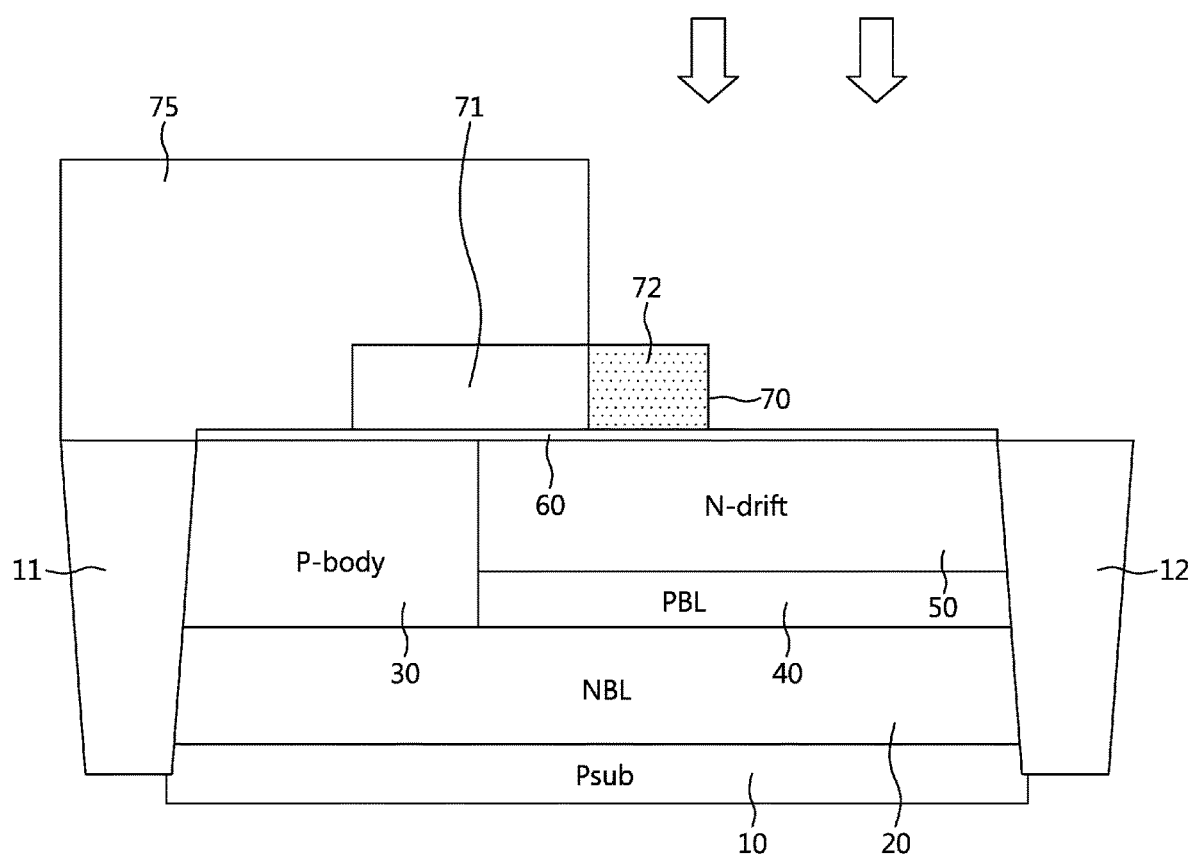

With reference to FIG. 8, a manufacturing method of a semiconductor device of the disclosure may be a process forming a high resistance region 72 in a gate electrode 70.

First, a first mask pattern 75 for an LDD ion implantation may be formed in a first region where a high concentration doping region 71 is formed. And a low concentration ion implantation (arrow) is performed toward a gate electrode 70. A low concentration ion implantation may be similar to an LDD ion implantation. In a case of a logic device, an LDD region may be formed by performing an LDD ion implantation after forming a gate electrode 70. When performing the LDD ion implantation, the mask cost may be reduced by opening the low concentration ion implantation region 72 when performing ion implantation. Thus, a first mask pattern 75 may be regarded as an LDD mask pattern using an N-type LDD mask pattern or a P-type LDD mask pattern. A first mask pattern may be removed after ion implantation.

Although it is not shown, a low concentration ion implantation may be performed with another method in the entire area of a gate electrode 70, without using a first mask pattern. Thus, the entire area of a gate electrode 70 may be changed to a low concentration doping region.

Figure 9:
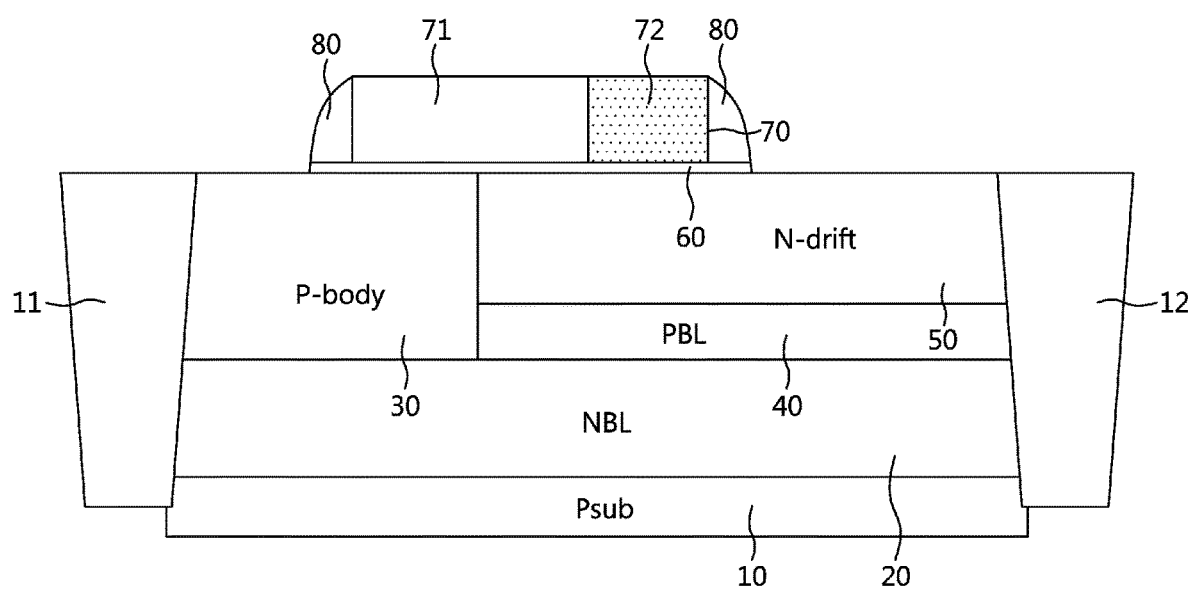

With reference to FIG. 9, a spacer 80 may be formed on each opposite side after a LDD ion implantation. For example, forming a spacer 80 on each opposite side of a gate electrode 70 may be conducted after forming a high resistance region 72 on the gate insulating film 60. The spacer 80 may be formed before forming a high concentration doping region 71.

Figure 10:
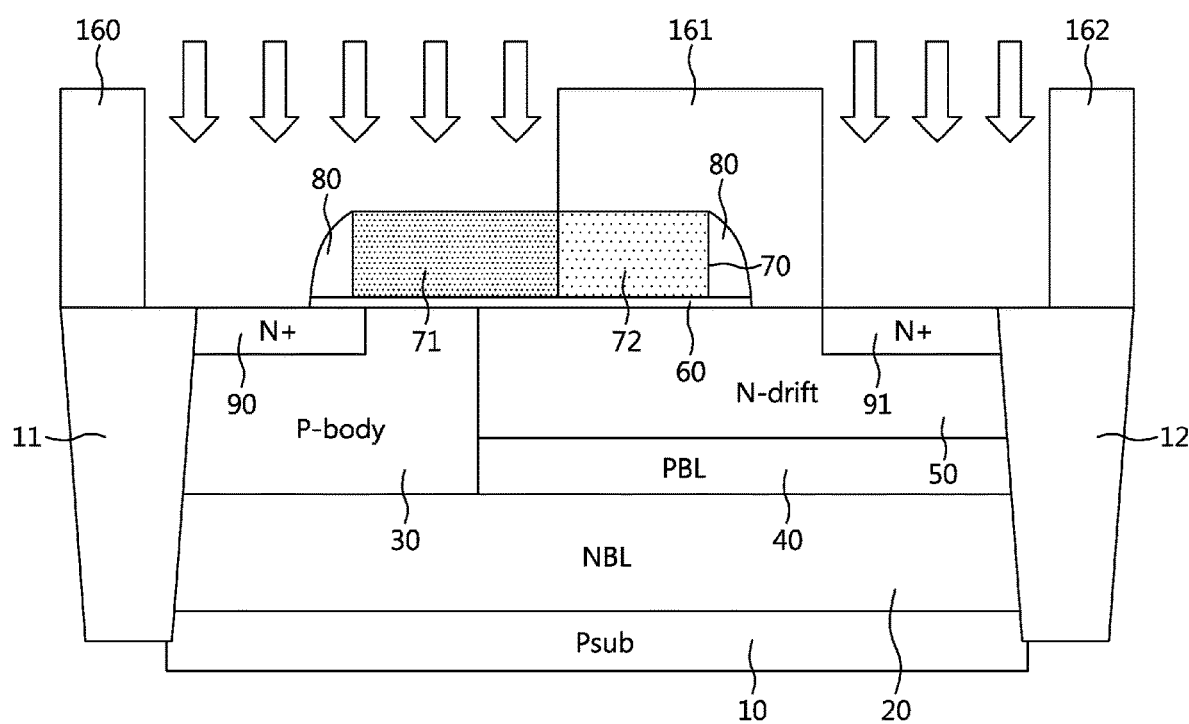

With reference to FIG. 10, second mask patterns 160, 161 and 162 may be formed using a photo resist (PR) to form a highly doped source region 90 and a highly doped drain region 91. After that, a high concentration ion implantation process may be performed. Herein, the second mask patterns 160, 161 and 162 may be called a high concentration doping blocking mask pattern 161.

A high concentration doping blocking mask pattern 161 may be formed to cover a portion of a gate electrode. Thus, it may protect a high resistance region 72 from a high concentration ion implantation. For an opened area without a mask pattern, the highly doped source region 90 and the highly doped drain region 91 may be formed in a substrate 10 by a high concentration ion implantation. The high concentration doping region 71 may be formed in the gate electrode 70. In a manufacturing method of a semiconductor device of the disclosure, it may be desirable that the high concentration doping region 71 of the gate electrode 70 has a higher doping concentration than the high resistance region 72. It may be higher about 5 to 6 orders, based on a dopant concentration. When the high concentration doping region 71 has $1E19$-$1E21/cm^3$, the high resistance region 72 may have a lower concentration, $1E13$-$1E17/cm^3$.

Figure 11:
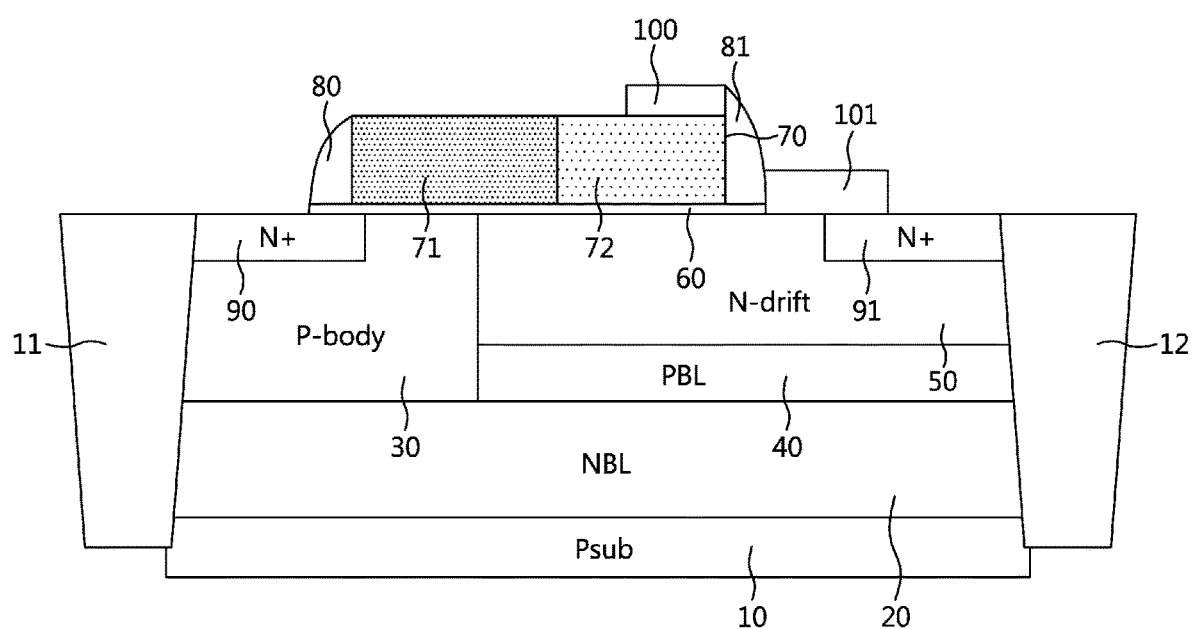

With reference to FIG. 11, a manufacturing method of a semiconductor device of the disclosure may be a process forming the silicide blocking insulating films 81, 100 and 101 on a first section of the gate electrode 70, after forming the highly doped source region 90 and the highly doped drain region 91.

The silicide blocking insulating films 81, 100 and 101 may be formed around the gate electrode 70. The silicide blocking insulating films 81, 100 and 101 may inhibit forming silicide films 110, 120 and 121.

A first silicide blocking insulating film 100 may be formed on a partial surface of the gate electrode 70. A second silicide blocking insulating film 81 may be formed on another side surface of the gate electrode 70. A third silicide blocking insulating film 101 may be formed on an N-type drift region 50 and a highly doped drain region 91. The first silicide blocking insulating film 100, the second silicide blocking insulating film 81, and the third silicide blocking insulating film 101 may be simultaneously formed in the same step.

The second silicide blocking insulating film 81 may be an insulating film combining a spacer 80 and a silicide blocking insulating film because the spacer 80 is formed on opposite sides of the gate electrode 70, and the silicide blocking insulating film is subsequently formed. The second silicide blocking insulating film 81 may have a similar shape with the spacer 80, but may be thicker than a spacer 80.

Herein, the silicide blocking insulating films 81, 100 and 101 may be connected to a spacer 80 formed on another side of a gate electrode and may show insulation property.

Figure 12:
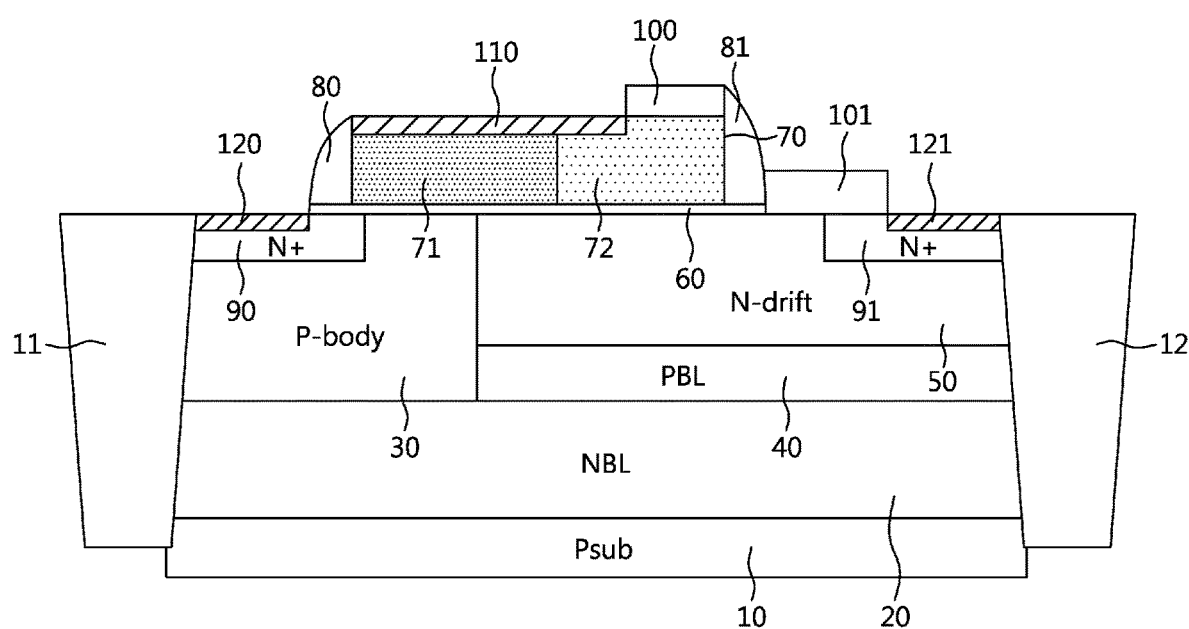

With reference to FIG. 12, a manufacturing method of a semiconductor device of the disclosure may form a gate silicide film 110 in a second section of the gate electrode 70, after forming silicide blocking insulating films 100 and 101 on a first section of the gate electrode 70. The gate silicide film 110 may contact the high concentration doping region 71 and the high resistance region 72.

Further, with reference to FIG. 12, forming first and second silicide films 120 and 121 in each of the highly doped source region 90 and the highly doped drain region 91 may be further included, which may be conducted simultaneously with the forming of the gate silicide film 110 in the second section of the gate electrode 70. NiSi, TiSi2, or CoSi2 may be used for the silicide films 110, 120 and 121.

FIG. 13 to FIG. 16 show stages of a manufacturing method of a semiconductor device according to one or more embodiments.

Figure 13:
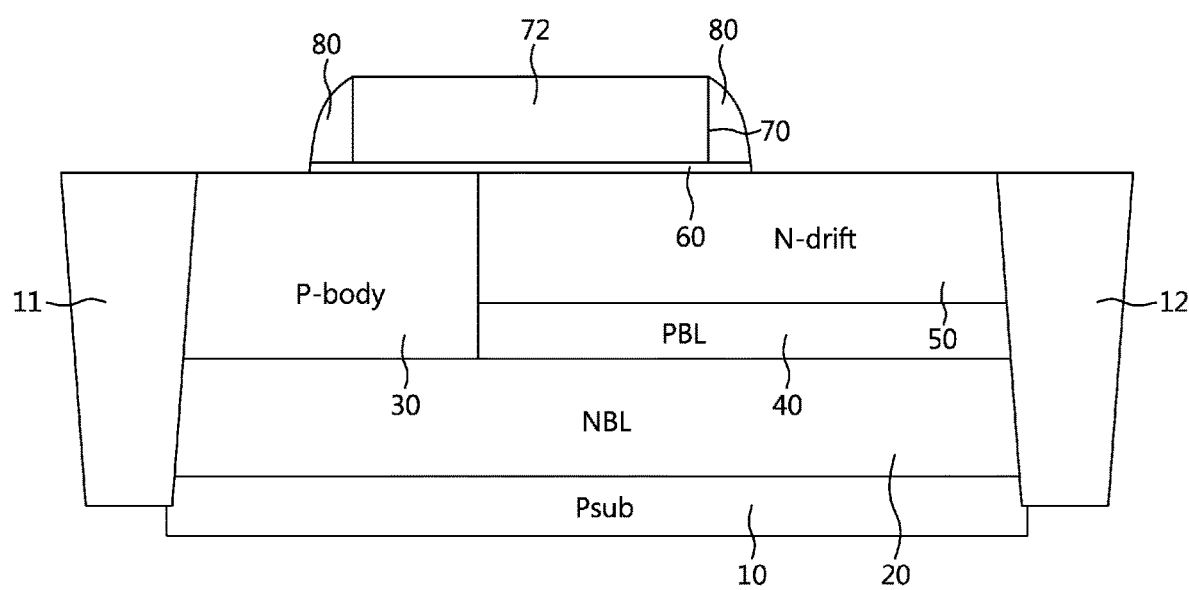
FIG. 13 to FIG. 16 show stages of a manufacturing method of a semiconductor device according to one or more embodiments.

With reference to FIG. 13, a manufacturing method of a semiconductor device of the disclosure is similar to FIG. 7, which was mentioned earlier. A gate electrode 70 is formed on a gate insulating film 60. The gate electrode 70 may be formed through a patterning process and depositing a conductive layer with a poly-silicon material on a gate insulating film. After forming the gate electrode 70, a spacer 80 may be formed on opposite sides of the gate electrode 70. Since the gate electrode 70 is not doped at all, a gate electrode 70 having a high resistance may be formed.

Figure 14:
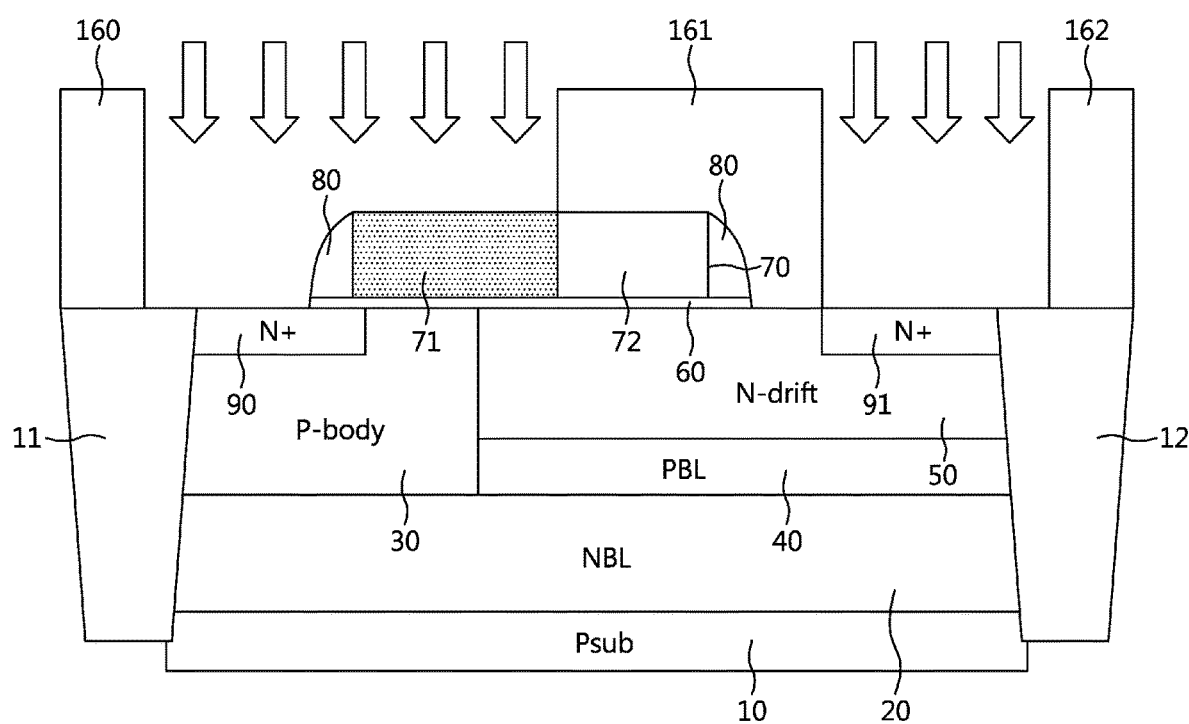

With reference to FIG. 14, second mask patterns 160, 161 and 162 may be formed using a photo resist (PR) to form a highly doped source region 90 and a highly doped drain region 91. After that, a high concentration ion implantation process may be performed. Herein, the second mask patterns 161, 161 and 162 may be called a high concentration doping blocking mask pattern.

A high concentration doping blocking mask pattern 161 may be formed to cover a portion of the gate electrode 70. Thus, it may protect a high resistance region from a high concentration ion implantation. For an opened area without a mask pattern, a highly doped source region 90 and a highly doped drain region 91 may be formed in a substrate 10 by a high concentration ion implantation. And, a high concentration doping region 71 may be formed in a gate electrode 70. In a manufacturing method of a semiconductor device of the disclosure, it may be desirable that the high concentration doping region 71 of a gate electrode 70 has a higher doping concentration than the high resistance region 72. In an example, the doping concentration may be higher by an order of about 4 to 5, based on a dopant concentration. For example, when a high concentration doping region 71 has $1E19$-$1E21/cm^3$, a high resistance region 72 may have a lower concentration, $1E11$-$1E15/cm^3$. A high resistance region 72 may be similar to an intrinsic region, because it is an undoped region without an ion implantation.

Figure 15:
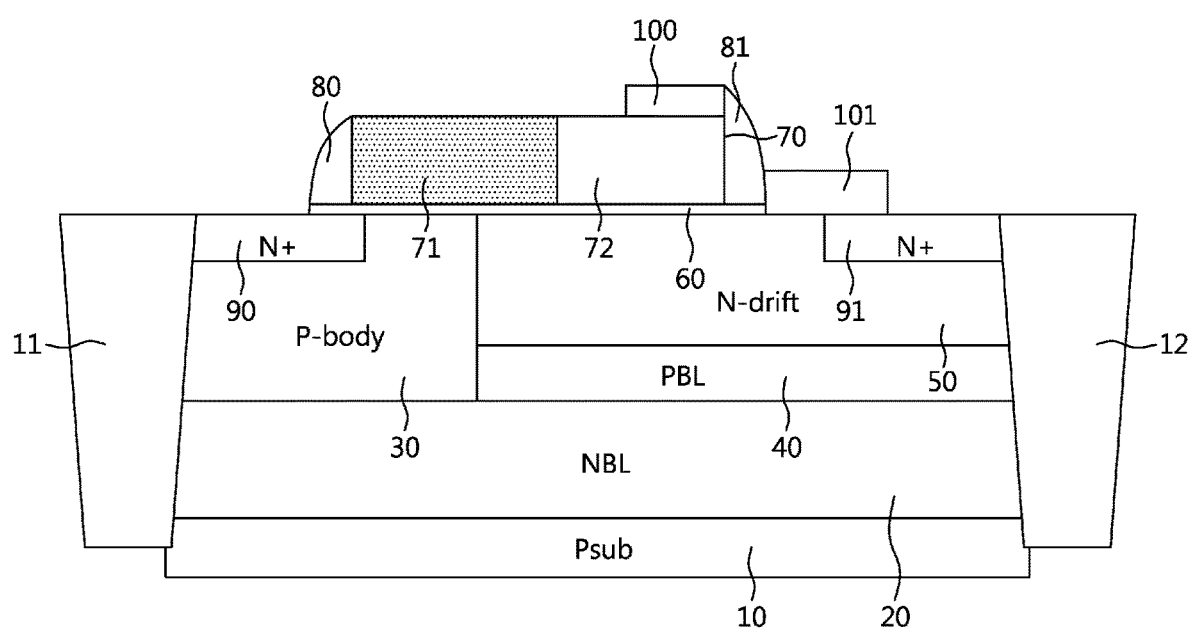

FIG. 15 follows a manufacturing method of a semiconductor device of the disclosure, which was described earlier. Silicide blocking insulating films 100 and 101 may be formed on a first section of the gate electrode 70.

Figure 16:
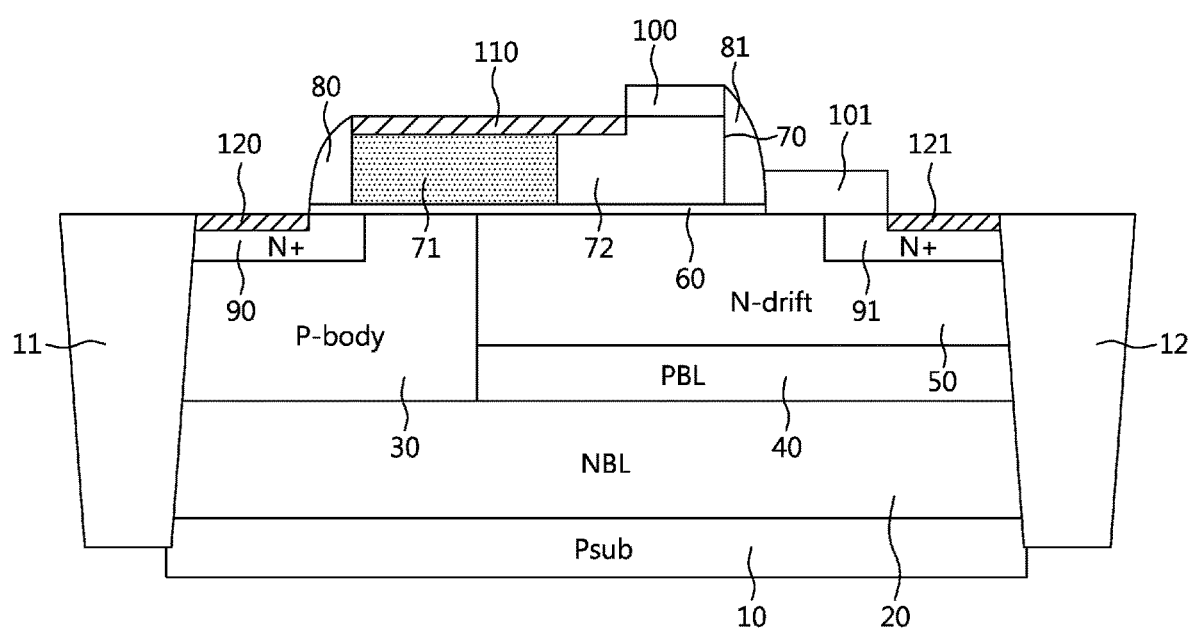

With reference to FIG. 16, a gate silicide film 110 may be formed in a second section of the gate electrode 70. A gate silicide film 110 may contact the high concentration doping region 17 and the high resistance region 72. First and second silicide films 120 and 121 may be also formed on the highly doped source region 90 and the highly doped drain region 91, respectively.

According to a semiconductor device and a manufacturing method of the disclosure as mentioned above, by applying a gate poly RESURF method, a self-protection capability (SPC) may be increased, and an Electro-Static Discharge (ESD) property may be improved. Further, since a total width of a Power-Array (PA) LDMOS, which is used for ESD, may be reduced, the chip size may be effectively decreased.

According to a semiconductor device and a manufacturing method of the disclosure, by applying a gate poly RESURF method, a lower cost and a high-efficiency property may be obtained by simplifying a process.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
    a P-type body region and an N-type drift region disposed in a substrate;
    a gate electrode disposed on the P-type body region and the N-type drift region and comprising a high concentration doping region and a high resistance region, wherein a dopant concentration of the high concentration doping region is higher than a dopant concentration of the high resistance region;
    a gate silicide film formed adjacent to a silicide blocking insulating film and disposed on the gate electrode so as to vertically overlap the high concentration doping region and the high resistance region,
    wherein the gate silicide film is formed on an entire upper surface of the high concentration doping region and a portion of an upper surface of the high resistance region, such that the high resistance region passes through an interface between the gate silicide film and the silicide blocking insulating film and extends to an interface between the high concentration doping region and the high resistance region;
    a highly doped source region disposed in the P-type body region;
    a highly doped drain region disposed in the N-type drift region;
    a first spacer on one sidewall of the gate electrode and adjacent to the highly doped source region, and a second spacer on the other sidewall of the gate electrode and adjacent to the highly doped drain region,
    wherein the silicide blocking insulating film comprises a first portion on an upper surface of the gate electrode, a second portion on the second spacer, and a third portion on the N-type drift region and in direct contact with a gate insulating film;
    a P-type buried layer abutting the P-type body region, having a different dopant concentration than the P-type body region, and disposed below the N-type drift region; and
    an N-type buried layer disposed below the P-type buried layer and the P-type body region,
    wherein the gate silicide film vertically overlaps the P-type body region, the N-type drift region and the P-type buried layer,
    wherein the high concentration doping region is in contact with the P-type body region and the N-type drift region via the gate insulating film, and the high resistance region is in contact with the N-type drift region via the gate insulating film, and
    wherein the interface between the high concentration doping region and the high resistance region is spaced apart from the interface between the gate silicide film and the silicide blocking insulating film.

2. The semiconductor device of claim 1, wherein the gate silicide film is in contact with the high concentration doping region and the high resistance region.

3. The semiconductor device of claim 1, further comprising:
    a deep trench structure disposed on each opposite side of the N-type buried layer.

4. The semiconductor device of claim 1, wherein the high resistance region is a low concentration doping region or an undoped region.

5. The semiconductor device of claim 1, wherein the high concentration doping region is closer to the highly doped source region than the highly doped drain region,
    wherein the high resistance region is closer to the highly doped drain region than the highly doped source region, and wherein a concentration of the high concentration doping region is similar to a concentration of either the highly doped source region or the highly doped drain region.

6. The semiconductor device of claim 1, wherein the silicide blocking insulating film is disposed to extend from the interface surface of the gate electrode to partially overlap the highly doped drain region, wherein the silicide blocking insulating film contacts the high resistance region, and wherein the high resistance region contacts the gate silicide film, the gate insulating film, and the silicide blocking insulating film.

7. The semiconductor device of claim 1, wherein a vertical boundary between the P-type body region and the P-type buried layer is spaced apart from the interface between the gate silicide film and the silicide blocking insulating film.

8. The semiconductor device of claim 1, wherein the interface between the high concentration doping region and the high resistance region is spaced apart from a vertical boundary between the P-type body region and the N-type drift region.

9. The semiconductor device of claim 1, further comprising:
a drain silicide layer disposed on the highly doped drain region,
wherein the third portion of the silicide blocking insulating film is disposed on the highly doped drain region and is adjacent to the drain silicide layer.

10. The semiconductor device of claim 1, wherein the gate insulating film is in contact with the high concentration doping region, the high resistance region, the P-type body region, the N-type drift region, the first spacer, the second spacer, and the third portion of the silicide blocking insulating film, respectively.

11. A semiconductor device, comprising:
a gate electrode disposed on a P-type body region and an N-type drift region and comprising a high concentration doping region and a high resistance region, wherein a dopant concentration in the high concentration doping region and a dopant concentration in the high resistance region are different;
a gate silicide film formed adjacent to a silicide blocking insulating film and disposed on the gate electrode so as to vertically overlap the high concentration doping region and the high resistance region,
wherein the gate silicide film is formed on an entire upper surface of the high concentration doping region and a portion of an upper surface of the high resistance region, such that the high resistance region passes through an interface between the gate silicide film and the silicide blocking insulating film and extends to an interface between the high concentration doping region and the high resistance region;
a highly doped source region disposed in the P-type body region;
a highly doped drain region disposed in the N-type drift region;
a first spacer on one sidewall of the gate electrode and adjacent to the highly doped source region, and a second spacer on the other sidewall of the gate electrode and adjacent to the highly doped drain region,
wherein the silicide blocking insulating film comprises a first portion on an upper surface of the gate electrode, a second portion on the second spacer, and a third portion on the N-type drift region and in direct contact with a gate insulating film;
a P-type buried layer abutting the P-type body region, having a different dopant concentration than the P-type body region, and disposed below the N-type drift region; and
an N-type buried layer disposed below the P-type buried layer and the P-type body region,
wherein the gate silicide film vertically overlaps the P-type body region, the N-type drift region, and the P-type buried layer,
wherein the high concentration doping region is in contact with the P-type body region and the N-type drift region via the gate insulating film, and the high resistance region is in contact with the N-type drift region via the gate insulating film, and
wherein the interface between the high concentration doping region and the high resistance region is spaced apart from the interface between the gate silicide film and the silicide blocking insulating film.

12. The semiconductor device of claim 11, wherein the high resistance region is spaced apart from the highly doped drain region.

13. The semiconductor device of claim 11, wherein a vertical boundary between the P-type body region and the P-type buried layer is spaced apart from the interface between the gate silicide film and the silicide blocking insulating film.

14. The semiconductor device of claim 11, wherein the interface between the high concentration doping region and the high resistance region is spaced apart from a vertical boundary between the P-type body region and the N-type drift region.

15. The semiconductor device of claim 11, further comprising:
a drain silicide layer disposed on the highly doped drain region,
wherein the third portion of the silicide blocking insulating film is disposed on the highly doped drain region and is adjacent to the drain silicide layer.

16. The semiconductor device of claim 11, wherein the gate insulating film is in contact with the high concentration doping region, the high resistance region, the P-type body region, the N-type drift region, the first spacer, the second spacer, and the third portion of the silicide blocking insulating film, respectively.

* * * * *